United States Patent [19]
Hey et al.

[11] Patent Number: 5,899,752
[45] Date of Patent: * May 4, 1999

[54] METHOD FOR IN-SITU CLEANING OF NATIVE OXIDE FROM SILICON SURFACES

[75] Inventors: H. Peter W Hey, San Jose; David Carlson, Santa Clara, both of Calif.

[73] Assignee: Applied Materials, Inc., Santa Clara, Calif.

[*] Notice: This patent is subject to a terminal disclaimer.

[21] Appl. No.: 08/429,432

[22] Filed: Apr. 26, 1995

Related U.S. Application Data

[63] Continuation-in-part of application No. 08/101,502, Jul. 30, 1993, abandoned.

[51] Int. Cl.$^6$ ................................................. H01L 21/318
[52] U.S. Cl. ......................... 438/791; 438/791; 438/906
[58] Field of Search ................................... 438/906, 775, 438/791

[56] References Cited

U.S. PATENT DOCUMENTS

| | | | |
|---|---|---|---|
| 3,652,324 | 3/1972 | Chu et al. | 438/906 |
| 4,590,091 | 5/1986 | Rogers, Jr. et al. | 427/53.1 |
| 4,855,254 | 8/1989 | Eshita et al. | 437/100 |
| 4,855,258 | 8/1989 | Allman et al. . | |
| 4,994,142 | 2/1991 | Appelbaum | 156/647 |
| 5,022,961 | 6/1991 | Izumi et al. | 156/646 |
| 5,028,560 | 7/1991 | Tsukamoto et al. | 437/81 |
| 5,032,545 | 7/1991 | Doan et al. . | |
| 5,089,441 | 2/1992 | Moslehi | 437/225 |
| 5,104,694 | 4/1992 | Saito et al. | 427/255 |
| 5,264,396 | 11/1993 | Thakur et al. | 438/906 |
| 5,294,568 | 3/1994 | McNeilly et al. | 437/235 |
| 5,296,258 | 3/1994 | Tay et al. | 427/96 |
| 5,303,558 | 4/1994 | Caton et al. | 62/55.5 |
| 5,322,809 | 6/1994 | Moslehi | 437/41 |
| 5,352,636 | 10/1994 | Beinglass | 437/235 |
| 5,360,769 | 11/1994 | Thakur et al. | 437/239 |
| 5,445,994 | 8/1995 | Thakur et al. | 438/775 |

FOREIGN PATENT DOCUMENTS

A 0430030 A2  6/1991  European Pat. Off. .
3-22527  1/1991  Japan .

OTHER PUBLICATIONS

S.Wolf Ph.D. et al., "Silicon Processing for the VLSI Era vol. 1: process technology," Lattice Press, CA, 1986, pp. 166–184.

S.Mukherjee, "Advanced Processing of Semiconductor Devices," Proceedings of SPIE Mar. 23–25, 1987 vol. 797, 10 pp. 90–97.

"Investigation of Thermal Removal of Native Oxide ..." by Tatsuya Yamazaki, et al., 1046 Journal of the Electrochemical Society 139 (1992) Apr., #4, Manchester, NH/US pp. 1175–1180.

"Effect of Silicon Surface Cleaning ..." by K. Saito, et al., 2419 Japanese Journal of Applied Physics (1989) Aug. 28–30, 21th Conf., Tokyo, Japan, pp. 541–542.

"Removing Native Oxide from Si (001) Surfaces ..." by Takayuki Aoyama, et al., Applied Physics Letters 59 (1991) Nov., 11, No. 20, New York, US, pp. 2576–2578.

"Si Surface Cleaning by $Si_2H_6$–$H_2$ Gas Etching ..." by Yasuo Kunii, et al., Japanese Journal of Applied Physics, vol. 26, No. 11, Nov., 1987, pp. 1816–1822.

"Alternate Surface Cleaning Approaches ..." by M. Racanelli, et al., 1046 Journal of the Electrochemical Society 138 (1991) Dec., No. 12, Manchester, NH, US, pp. 3783–3789.

"Letter to the Editor LPCVD $Si_3N_4$ Growth Retardation on Silicon ..." Francois Martin, et al., 8303 Semiconductor Science & Technology 6 (1991) Nov., #11, Bristol, GB pp. 1100–1102.

*Primary Examiner*—Charles Bowers
*Assistant Examiner*—Matthew Whipple
*Attorney, Agent, or Firm*—Fish & Richardson P.C.

[57] ABSTRACT

A method of in-situ cleaning a native oxide layer from the surface of a silicon wafer positioned in a vacuum chamber that is substantially free of oxidizing species by passing at least one non-oxidizing gas over the native oxide layer at a wafer cleaning temperature between about 650° C. to about 1025° C. for a sufficient length of time until such native oxide layer is removed.

5 Claims, 3 Drawing Sheets

METHOD FOR IN-SITU CLEANING OF NATIVE OXIDE FROM SILICON SURFACES

This is a continuation-in-part of copending application Ser. No. 08/101,502 filed on Jul. 30, 1993.

FIELD OF THE INVENTION

The present invention generally relates to a novel method of cleaning native oxide from a silicon wafer surface and more particularly, relates to a novel method of in-situ cleaning a native oxide layer from the surface of a silicon wafer by heat in the presence of at least one reducing gas.

BACKGROUND OF THE INVENTION

In the fabrication of semiconductor devices on silicon wafers, various structures such as metalization layers, passivation layers, insulation layers, etc. are formed on a silicon substrate. The quality of the semiconductor device fabricated is a strong function of the processes with which these structures are formed. The quality is also a function of the cleanliness of the manufacturing environment in which the silicon wafer is processed.

Technological advances in recent years in the increasing miniaturization of semiconductor circuits require more stringent control of impurities and contaminants in the processing chamber of the semiconductor device. When the miniaturization of the device progressed to the submicron level, the minutest amount of contaminants can significantly reduce the yield of wafers.

Among the electronic materials frequently used for deposition on silicon wafers, silicon nitride has gained more importance in recent years. Silicon nitride is used extensively as a final protective passivation and coating layer for semiconductor wafers because of its excellent diffusion barrier characteristics against moisture and alkali ions. Silicon nitride is a desirable semiconductor material also for its high density and high dielectric properties.

The deposition of silicon nitride is usually performed by a low pressure chemical vapor deposition (hereinafter LPCVD) process in which dichlorosilane and ammonia are reacted together in a heated chamber. The reaction between silicon tetrachloride or dichlorosilane and ammonia normally takes place with nitrogen carrier gas at approximately 650° C. or with hydrogen carrier gas at approximately 1,000° C.

In a LPCVD process for the deposition of silicon nitride, the LPCVD chamber is first evacuated, a mixture of gases of silicon tetrachloride or dichlorosilane and ammonia is then introduced into the chamber which contains one or more silicon wafers each having a surface onto which a silicon nitride layer is to be deposited. The silicon wafers are generally heated to a deposition temperature at the time when the mixture of gases are fed into the chamber such that the gases decompose and thereby depositing a silicon nitride layer on the surface of the wafer. For instance, in a prior-art LPCVD system equipped with a horizontal boat that receives a plurality of silicon wafers positioned vertically in the chamber, reactant gases are injected into the chamber through a number of apertures and flow across the wafers. The use of such prior-art chambers encourages the growth of native oxide on the surfaces of the wafers.

Chemical native oxide is not a true silicon dioxide because it is not stoichiometrically formed. Native oxide layers are typically formed after a cleaning procedure partially due to the presence of moisture in the air. Native oxide is chemically different than grown silicon oxide which is intentionally deposited or formed. The physical properties of native oxide and silicon dioxide are also different, for instance, the refractive index of silicon dioxide is typically 1.45 while the refractive index for native oxide is approximately 2.2.

Native oxide also forms on wafer surfaces during prior processing steps which expose the wafer to ambient conditions. Some semiconductor processes include various cleaning steps prior to deposition of electronic materials. However, the cleaned wafers are usually still exposed to the ambient atmosphere after such cleaning and native oxide has the opportunity to grow on the wafer surface prior to the silicon nitride deposition.

For instance, the handling of multiple wafers in a wafer boat at multiple processing stations during a semiconductor fabrication process causes particular problems with regard to the formation of native oxide. The wafers take significant amount of time to load into the chamber, i.e. on the order of thirty minutes. During such loading step, air is present around the wafers and a native oxide layer readily forms on the newly cleaned surface of the wafer. This problem is compounded by the fact that such native oxide formation is not uniform, i.e., the first wafer in the chamber may grow a thicker layer of native oxide. This leads to a batch of integrated circuit structures having different electrical properties depending on the particular wafer from which the integrated circuit structures were formed.

It is therefore desirable that prior to the deposition of any layer of semiconductor materials on a silicon wafer, the surface of the wafer should be clean and free of contaminants such as native oxide or other impurities. Contaminants present at the interface between the silicon surface of the wafer and the layer formed thereon interfere with the electrical properties of the integrated circuit structures resulting in degraded performance or total failure of the structure.

It has been observed that the growth of silicon nitride films on a silicon wafer can be affected by the presence of native oxide on the silicon surface. This manifests itself as an "incubation time" during which growth of the nitride layer is retarded on the native oxide surface. A typical test for this incubation time can be conducted by depositing layers of silicon nitride under identical conditions but with varying deposition times. Longer deposition times correspond to thicker nitride films. A graph of the silicon nitride film thickness versus the deposition time therefore shows a straight line. This is shown in FIG. 1 as the solid line. The slope of this straight line represents the growth rate of the silicon nitride films.

Theoretically, the intercept at time equal to zero should show that the thickness of the nitride film is zero. However, in reality, thin films of silicon nitride exhibit a variable intersect of the horizontal axis at times from one to thirty or more seconds. The length of this time is referred to as the "incubation time", shown in FIG. 1 as A, since little growth of silicon nitride is observed during this time period. We have discovered that various process parameters affect the length of incubation time, as well as the thickness of native oxide on the silicon surface.

The incubation time has several detrimental effects in the formation of silicon nitride films on semiconductor devices. For instance, thin layers of silicon nitride are frequently used to form capacitor structures. The thickness control for thin silicon nitride dielectric films is therefore very surface and process dependent which in turn makes the capacitor control very difficult. Furthermore, a native oxide layer of variable thickness can reduce the capacitance of the dielectric layer, i.e. native oxide plus nitride, and further degrade the capacitor performance.

Others have attempted to clean a native oxide layer from the surface of a silicon wafer by a baking process at temperatures as high as 1,200° C. However, such high temperature baking is only suitable in an epitaxial silicon growth process and not suited for a silicon nitride film process which is normally deposited at a much lower temperature.

It is therefore an object of the present invention to provide a novel method of in-situ cleaning native oxide from the surface of a silicon wafer that does not have the shortcomings of the conventional cleaning method.

It is another object of the present invention to provide a novel method of in-situ cleaning native oxide from the surface of a silicon wafer such that a clean interface is provided between a single crystal silicon wafer and a subsequently deposited semiconductor material.

It is a further object of the present invention to provide a novel method of in-situ cleaning native oxide from the surface of a silicon wafer such that the incubation period normally encountered in a silicon nitride film deposition process can be eliminated.

It is another further object of the present invention to provide a novel method of in-situ cleaning native oxide from the surface of a silicon wafer by heating the wafer to a modest temperature in an environment substantially free of oxidizing species such as oxygen and water.

It is yet another further object of the present invention to provide a novel method of in-situ cleaning native oxide from a silicon wafer surface by heating the wafer to a modest temperature in an environment substantially free of oxidizing species in the presence of at least one reducing gas.

SUMMARY OF THE INVENTION

In accordance with the present invention, a novel method of in-situ cleaning a native oxide layer from the surface of a silicon wafer in a substantially oxygen and water free environment by the combined processes of physical evaporation and chemical reaction is provided.

In the preferred embodiment, the novel in-situ cleaning method is provided by heating a silicon wafer to a temperature in the range of 800~1025° C. while concurrently flowing a hydrogen or other reducing gas at a sufficiently high flow rate in an environment substantially free of oxidizing species such as oxygen and water. The necessary conditions for native oxide layer removal in this preferred embodiment are an environment that is substantially free of oxidizing species in a leak-tight process chamber and a modest chamber temperature. The hydrogen gas is used to provide the necessary background level of reducing or reoxidizing species. A native oxide layer is typically removed in one minute or less under these conditions.

In an alternate embodiment, the novel in-situ cleaning method is provided by adding a reactive gas to the process chamber to facilitate the native oxide removal. A precursor for silicon CVD such as silane, dichlorosilane at very low partial pressures can be utilized to grow a non-continuous silicon layer above the native oxide layer to facilitate the removal of native oxide at approximately 700~900° C.

In another alternate embodiment, the novel in-situ cleaning method is provided by adding to the process chamber a reactive gas of germane which removes native oxide at approximately 700~800° C. through the formation of volatile germanium-oxygen compounds. Other alternate reactive gases such as fluorine-containing species are also used to chemically attack the native oxide and cause its removal.

BRIEF DESCRIPTION OF THE DRAWINGS

Other objects, features and advantages of the present invention will become apparent upon consideration of the specification and the appended drawings, in which.

DETAILED DESCRIPTION OF THE EMBODIMENTS

The present invention discloses a novel method of in-situ cleaning of a native oxide layer from the surface of a silicon wafer by heating the wafer to a modest temperature in an environment that is substantially free of oxidizing species such as oxygen and water.

Figure 2:
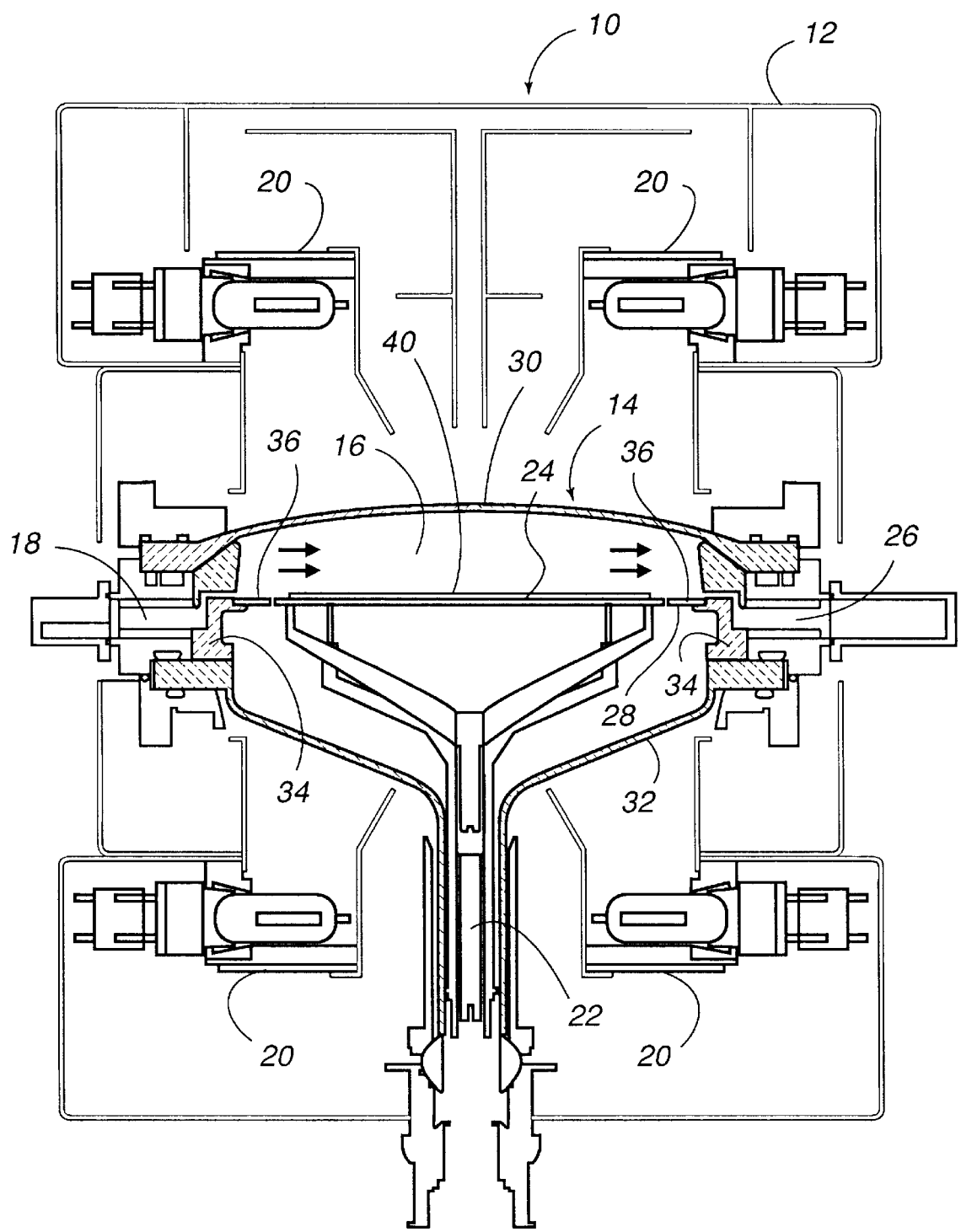
FIG. 2 is a cross-sectional view of a typical single-wafer CVD apparatus.

Referring initially to FIG. 2, where a cross-sectional view of a typical single-wafer CVD apparatus is shown. Such single-wafer processing equipment are being designed as multi-chamber clustered integrated processing system incorporating the use of load-lock systems wherein a wafer can be transported from one single-wafer process chamber to another through a central load-lock system without breaking vacuum. One such system for CVD deposition is supplied by the Applied Materials Corporation in Santa Clara, Calif. under the trademark of Centura™ HT Poly.

A thermal reactor 10 for processing a silicon wafer 40 that has a housing 12, a double-dome reactor vessel 14 that defines a reactor chamber 16, a gas inlet manifold 18, a gas exhaust manifold 26, a heating system 20, a drive assembly 22, a susceptor 24, and a preheat ring 28, is shown in FIG. 2. Double-dome vessel 14 includes a top dome 30 and a bottom dome 32 which are cooled by circulating cooling air such that a cold wall, i.e. at 100~200° C. is maintained. The drive assembly 22 is coupled to a motor (not shown) to rotate susceptor 24 during the deposition process to enhance coating uniformity.

The present invention provides a novel method of in-situ cleaning native oxide from the surface of a silicon wafer such that the incubation period observed in a silicon nitride film deposition process can be eliminated. This novel method can best be understood by an examination of FIG. 3, which shows a flow chart of the present method.

Figure 3:
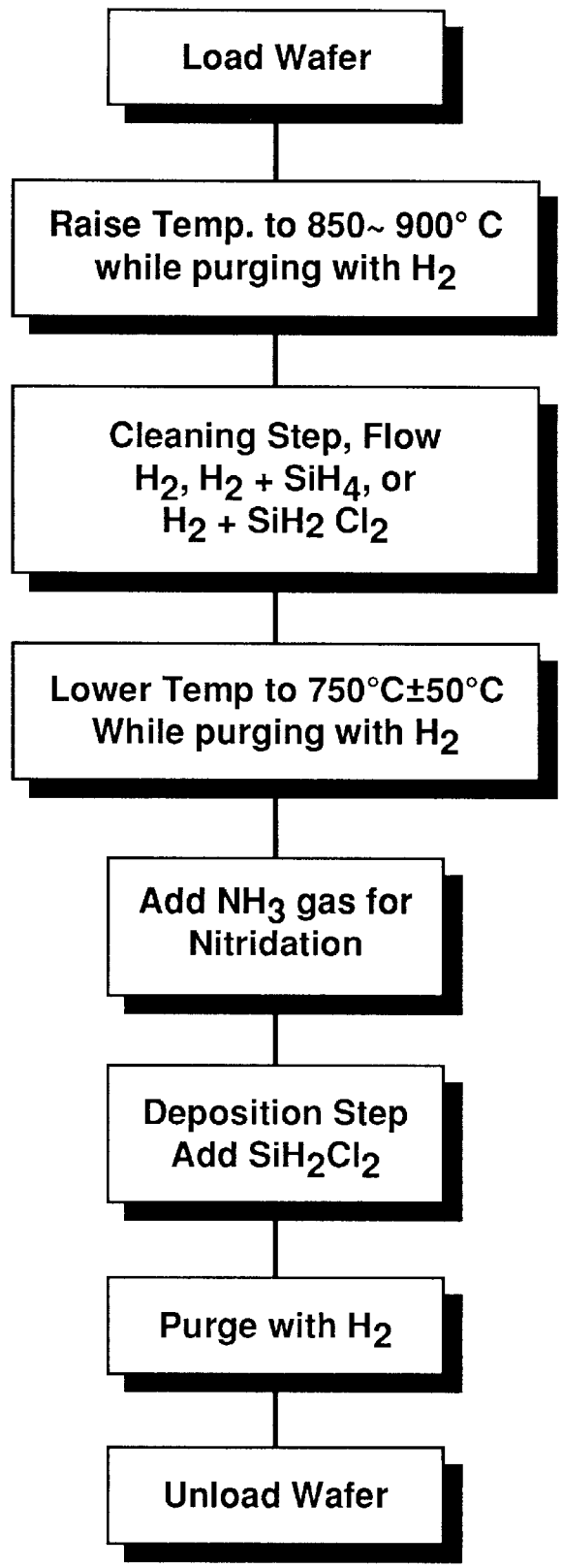
FIG. 3 is a flow diagram illustrating the novel in-situ cleaning process in combination with a deposition process for silicon nitride films.

As shown in FIG. 3, the present method can be practiced by first loading a wafer into a typical cold-wall CVD deposition system. The wafer can be either a silicon wafer or a silicon wafer with a silicon dioxide coating. These wafers may have been previously cleaned by dipping in hydrogen fluoride. The load-lock chamber is first evacuated to a pressure of less than 10 Torr. The wafer is then loaded from the load-lock chamber into the process chamber at the deposition pressure. The temperature of the chamber is then raised to 800~950° C. while flowing with hydrogen gas. When hydrogen gas alone is used for cleaning the native oxide from a silicon surface, it is flowed at a rate up to 20

SLM while the chamber is heated to 900° C. The evacuation process insures that there are substantially no oxidizing species, i.e. less than a partial pressure of $10^{-5}$ Torr of oxygen and water left in the chamber. The native oxide layer can be cleaned in approximately one minute.

The partial pressure of oxygen and water is measured by a typical residual gas analyzer technique used for vacuum systems. One of such analyzer utilized in the present work is the Inficon Quadrex 200, Model #901-002-G1, which is manufactured by the Leybold Inficon Co. of East Syracuse, N.Y.

As shown further in FIG. 3, the cleaning step may also comprise the step of flowing the chamber with a reactive gas together with the hydrogen. This reactive gas can be either silane or dichlorosilane flowed at a low flow rate. The purpose of adding silane or dichlorosilane to the chamber is to grow a non-continuous silicon layer over the native oxide layer such that the native oxide can be removed at about 800° C. It is noted that by the addition of silane or dichlorosilane, a lower cleaning temperature of 800° C., instead of 900° C. when hydrogen gas alone is used, can be utilized. Other silicon-bearing gases may also work as reactive cleaning gases for removing native oxide from silicon surfaces. The flow rate used for the silicon-bearing gas is normally less than 1 sccm which is substantially lower than the flow rate used for hydrogen.

After the cleaning step, as shown in FIG. 3, the chamber temperature is lowered to 750±50° C. while continuously purging with hydrogen. It should be noted that while FIG. 3 shows a continuous process of first cleaning and then depositing a silicon nitride film on the same silicon wafer, the cleaning step illustrated in FIG. 3 can be used for other deposition processes. For instance, it can be used prior to a selective epitaxial growth (SEG) process in which epitaxial silicon is grown inside windows of silicon nitride or polysilicon. The temperature used in a SEG process is relatively low, i.e. 750–850° C., when compared to a conventional epitaxial silicon growth process which requires a minimum temperature of 1,100° C. The SEG process is important for making advanced devices in which a planar surface is desired which requires the windows to be filled completely by epitaxial silicon.

Figure 1:
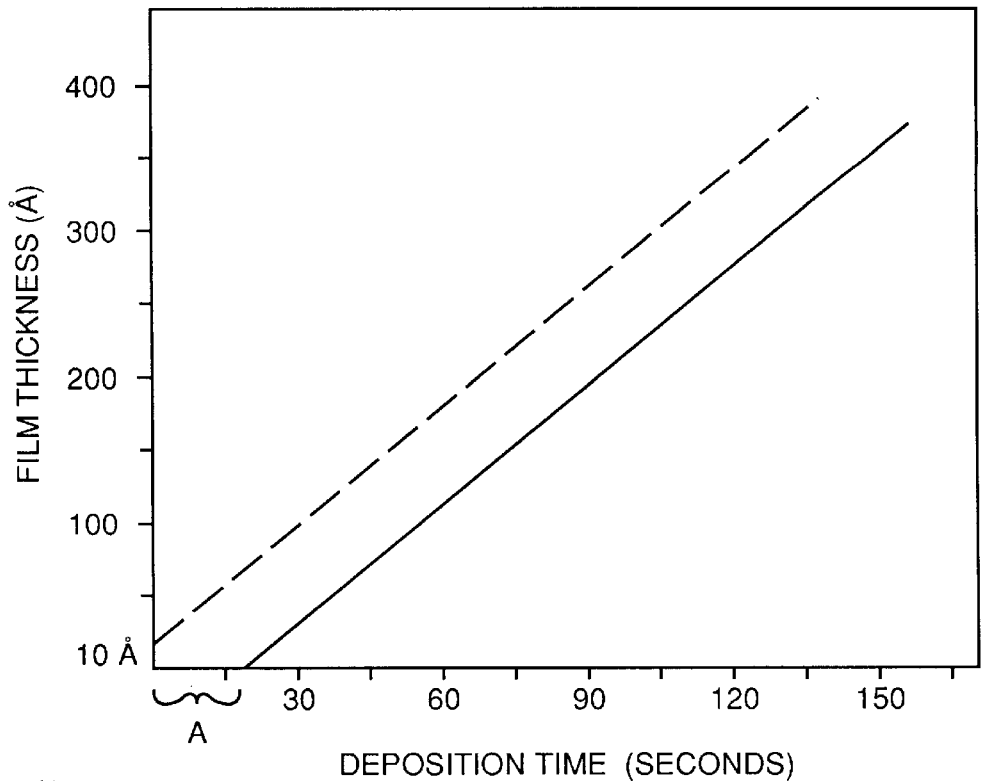
FIG. 1 is a graph showing the silicon nitride film thickness as a function of the deposition time.

When the deposition of a silicon nitride film is desired on a cleaned silicon wafer surface, as shown in FIG. 3, an ammonia gas may first be added to the chamber for a nitridation process. It was discovered that such a nitridation process forms a pre-deposited silicon nitride layer up to approximately 10 Å thickness. This is shown in FIG. 1 by the intercept of the dashed line. FIG. 1 also shows a solid line which indicates a silicon nitride film deposition process conducted by a conventional method without wafer surface cleaning indicating an incubation time of approximately 20 seconds.

After the nitridation process, the deposition of silicon nitride is continued by flowing dichlorosilane into the reactor chamber. After a sufficient thickness of silicon nitride film is formed by the reaction between dichlorosilane and ammonia, i.e. up to 1500 Å, the flow of ammonia and dichlorosilane is stopped and the chamber is purged with hydrogen gas prior to the unloading of the wafer from the process chamber.

Figure 4:
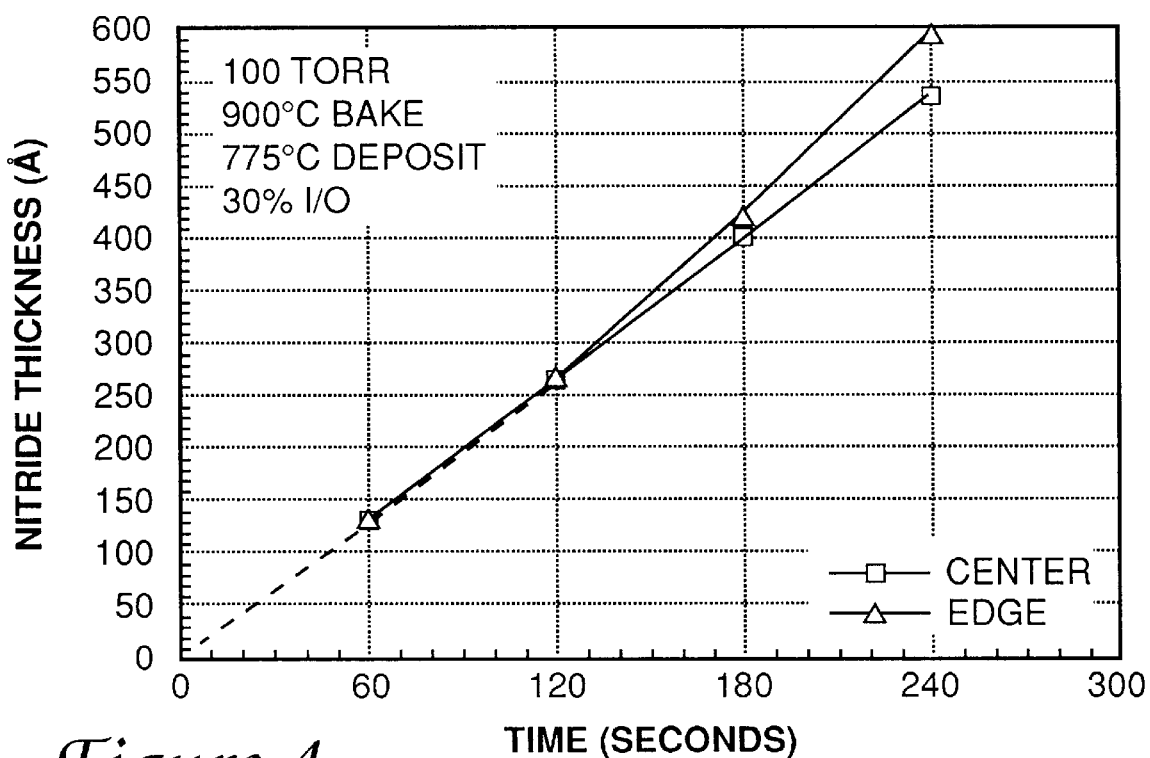
FIG. 4 is a graph showing the silicon nitride film thickness as a function of the deposition time measured at the center and at the edge of a wafer.

FIG. 4 shows data of the silicon nitride film thickness as a function of the deposition time. The film thickness is measured both at the center of the wafer and at the edge of the wafer. Only hydrogen gas was flowed through the reactor chamber. It is seen that a uniform film of silicon nitride is formed on the silicon wafer. Data shown in this graph is generated at a 900° C. bake temperature, a 775° C. deposition temperature, and a chamber pressure of 100 Torr.

Table I shows data generated in seven tests by using hydrogen and silane gases at various temperature and pressure settings.

TABLE I

| Test# | Cleaning Gas | Temp., ° C. | Flow Rate | | Chamber Pressure, Torr | Substrate | Change, Å |
|---|---|---|---|---|---|---|---|
| | | | $H_2$, SLM | $SiH_4$, sccm | | | |
| 1. | $H_2$ | 900 | 10 | 0 | 20 | Silicon- No HF | −3 |
| 2. | $H_2$ | 900 | 20 | 0 | 100 | Silicon- HF Dip | −1 |
| 3. | $H_2$ | 900 | 20 | 0 | 100 | Silicon- HF Dip | −2 |
| 4. | $SiH_4$ | 750 | 10 | .4 | 20 | Oxide | −4 |

Tests #1 through #3 were conducted with a cleaning gas of hydrogen only. When the chamber temperature is at 900° C., a reduction of the native oxide thickness is observed in all three tests. The efficiency of native oxide film removal does not seem to increase with the flow rate of the hydrogen gas. The cleaning efficiency of hydrogen gas is higher for silicon wafers that were not previously cleaned by a hydrogen fluoride dip. A suitable range of chamber temperatures when native oxide film is cleaned by hydrogen alone is between 800° C. and 1025° C.

When silane is added to the chamber with hydrogen gas, as shown in Tests #4, it is seen that an efficient cleaning by a mixture of hydrogen and silane is obtained at a low chamber temperature of 750° C. Test #4 was conducted on a silicon dioxide surface. It should be noted that the flow rate used for silane is several orders of magnitude smaller than the flow rate used for hydrogen. A suitable range of chamber temperature for cleaning by silane or dichlorosilane is between 700° C. and 840° C.

The cleaning efficiency of fluorine-containing gases and germane-containing gases has also been tested. These gases are suitable for cleaning native oxide from the surface of a silicon wafer at a lower cleaning temperature of approximately 700° C. to 750° C. Satisfactory cleaning results have been obtained by using these gases in cleaning native oxide from silicon wafers.

The novel method of cleaning native oxide from surfaces of silicon wafers has been demonstrated as an effective and advantageous process for preparing high quality silicon wafers. Even though only silicon nitride films and epitaxial silicon films deposited by a selective epitaxial growth process are discussed, any other films of semiconductor materials can be deposited on a silicon wafer surface after such cleaning procedure.

While the present invention has been described in an illustrative manner, it should be understood that the terminology used is intended to be in a nature of words of description rather than of limitation.

Furthermore, while the present invention has been described in terms of several preferred embodiments thereof, it is to be appreciated that those skilled in the art will readily apply these teachings to other possible variations of the invention. For instance, reactive gases other than silane, dichlorosilane, germane, and fluorine can be used which may be equally effective in achieving the desirable results of the present invention.

The embodiments of the invention in which an exclusive property or privilege is claimed are defined as follows:

1. A method of processing a silicon wafer, the wafer having a native oxide thereon, comprising:

positioning said silicon wafer in a chemical vapor deposition chamber;

evacuating said chamber until the chamber pressure is less than about $10^{-5}$ Torr of oxygen and water;

flowing hydrogen and at least one other reducing gas selected from the group consisting of silane and dichlorosilane over the surface of said silicon wafer;

thereafter, heating said silicon wafer to a wafer cleaning temperature of not higher than about 1025° C. while continuing to flow hydrogen over the surface of said silicon wafer until an evaporation and a chemical reaction remove substantially all native oxide from the surface of the silicon wafer; and then forming a layer of silicon nitride on the surface of said silicon wafer without removing the wafer from said chamber by passing a mixture of dichlorosilane gas and ammonia gas over the surface of said silicon wafer at a deposition temperature not higher than said wafer cleaning temperature.

2. A method according to claim 1 further comprising, after the step of removing the native oxide, reducing the temperature within said chamber to a deposition temperature in the range between about 700° C. to 800° C.

3. A method according to claim 1 wherein said native oxide is removed within no more than 1 minute.

4. A method according to claim 1 wherein said wafer cleaning temperature is in the range between 700° C. to 840° C.

5. A method according to claim 1, wherein said wafer cleaning temperature is preferably in the range between about 800° C. to about 1025° C.

* * * * *